US012191216B2

(12) United States Patent
Odanaka

(10) Patent No.: US 12,191,216 B2
(45) Date of Patent: Jan. 7, 2025

(54) LASER PROCESSING APPARATUS AND METHOD OF CORRECTING CONVERGED SPOT POSITION

(71) Applicant: DISCO CORPORATION, Tokyo (JP)

(72) Inventor: Kentaro Odanaka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 772 days.

(21) Appl. No.: 17/405,330

(22) Filed: Aug. 18, 2021

(65) Prior Publication Data

US 2022/0068729 A1 Mar. 3, 2022

(30) Foreign Application Priority Data

Aug. 31, 2020 (JP) ................................ 2020-146368

(51) Int. Cl.
| | |
|---|---|
| *H01L 21/66* | (2006.01) |
| *B23K 26/00* | (2014.01) |
| *B23K 26/02* | (2014.01) |
| *B23K 26/08* | (2014.01) |
| *G05D 3/20* | (2006.01) |
| *H01L 21/78* | (2006.01) |

(Continued)

(52) U.S. Cl.
CPC .......... *H01L 22/26* (2013.01); *B23K 26/0006* (2013.01); *B23K 26/02* (2013.01); *B23K 26/0853* (2013.01); *G05D 3/20* (2013.01); *H01L 21/78* (2013.01); *B23K 2101/40* (2018.08); *G01K 13/00* (2013.01)

(58) Field of Classification Search
CPC ........... B23K 26/048; B65D 2581/3494; B41J 2/1635
See application file for complete search history.

(56) References Cited

U.S. PATENT DOCUMENTS

| 6,590,633 B1 * | 7/2003 | Nishi | ...................... G03F 7/707 |
| | | | 269/21 |
| 2004/0002199 A1 * | 1/2004 | Fukuyo | ................. C03B 33/023 |
| | | | 438/106 |

FOREIGN PATENT DOCUMENTS

| JP | 2000263264 A | 9/2000 |
| JP | 2002192370 A | 7/2002 |
| JP | 2003320466 A | 11/2003 |

(Continued)

OTHER PUBLICATIONS

Search report issued in counterpart Singapore patent application No. 10202108931S, dated Sep. 14, 2022.

(Continued)

*Primary Examiner* — Jimmy Chou
*Assistant Examiner* — William C. Gibson
(74) *Attorney, Agent, or Firm* — Greer Burns & Crain Ltd.

(57) ABSTRACT

A laser processing apparatus includes a laser beam applying mechanism for applying a laser beam to a workpiece held by a holding mechanism while keeping a converged spot of the laser beam in the workpiece, and a temperature detector for detecting a temperature of the holding mechanism or a temperature of an actuator of a moving mechanism that moves the holding mechanism in a processing feed direction. The laser beam applying mechanism has a converged spot position adjusting unit. The controller, depending on a temperature change detected by the temperature detector, controls the converged spot position adjusting unit to establish a position of the converged spot of the laser beam in a thicknesswise direction of the workpiece.

6 Claims, 7 Drawing Sheets

(51) Int. Cl.
*B23K 101/40* (2006.01)
*G01K 13/00* (2021.01)

(56) References Cited

FOREIGN PATENT DOCUMENTS

| | | |
|---|---|---|
| JP | 2005088053 A | 4/2005 |
| JP | 2017054032 A | 3/2017 |
| JP | 2017070966 A | 4/2017 |

OTHER PUBLICATIONS

Office Action issued in counterpart Japanese patent application No. 2020-146368, dated Feb. 16, 2024.

* cited by examiner

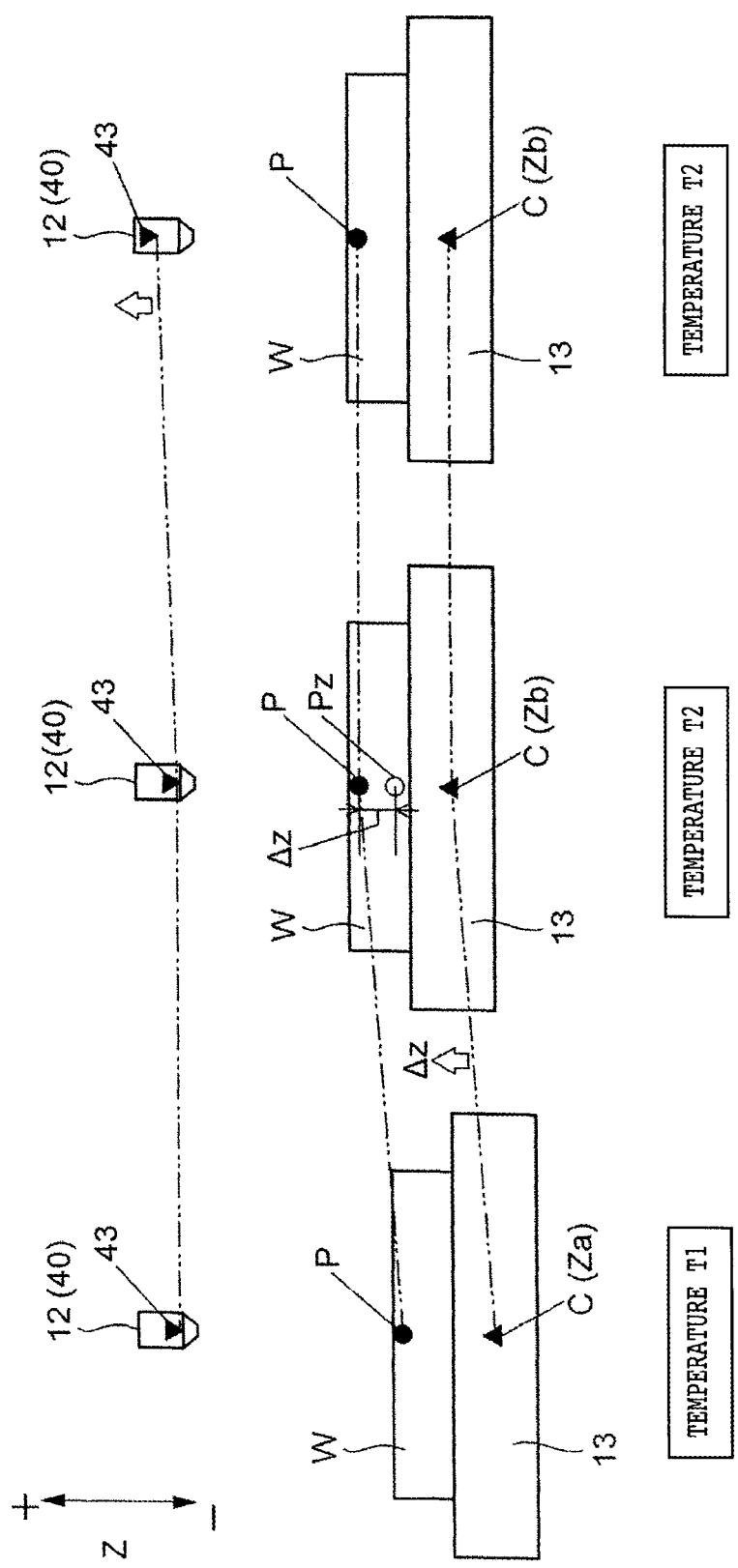

LASER PROCESSING APPARATUS AND METHOD OF CORRECTING CONVERGED SPOT POSITION

BACKGROUND OF THE INVENTION

Field of the Invention

The present invention relates to a laser processing apparatus, and more particularly to a technology for eliminating a reduction in processing quality due to a shift in the position of a converged spot of a laser beam.

Description of the Related Art

According to a process of fabricating semiconductor devices, a semiconductor wafer with a plurality of devices formed on a face side thereof is divided into a plurality of semiconductor device chips. Semiconductor wafers are divided by cutting apparatuses having cutting blades that have widely been used heretofore and also by laser processing apparatuses, recently in wide use, that are capable of increasing processing feed speeds compared with the cutting apparatuses and of reducing cutting margins. On the laser processing apparatuses, a laser beam emitted from a laser oscillator is applied to a semiconductor wafer.

On the cutting apparatuses that cut semiconductor wafers with rotating cutting blades, a holding table for holding semiconductor wafers is processing-fed at a speed in the range approximately from 80 to 100 mm/s. On the laser processing apparatuses, a holding table for holding semiconductor wafers is processing-fed at a speed in the range approximately from 100 to 600 mm/s. In recent years, efforts have been made to increase the speed at which to feed the holding table up to a range approximately from 600 to 1000 mm/s or higher.

Japanese Patent Laid-open No. 2003-320466 discloses a laser processing apparatus that performs laser ablation on semiconductor wafers that are processing-fed at high speeds. Japanese Patent No. 3408805 discloses a laser processing apparatus that performs what is generally called a stealth dicing process in which a converged spot of a laser beam is positioned within a wafer to form modified layers therein.

SUMMARY OF THE INVENTION

When a holding table that holds a semiconductor wafer as a workpiece is processing-fed at a high speed, a moving mechanism for moving the holding table at the high speed tends to generate heat. Specifically, an electric motor included as an actuator in the moving mechanism generates heat, thermally expanding components that are affected by the heat. The thermally expanded components may change the position of the workpiece held on the holding table, with the result that the converged spot of the laser beam may not be positioned at desired positions in the workpiece. As a consequence, the workpiece may not be processed as desired, resulting in a reduction in processing quality.

There have been taken various measures to alleviate the above difficulties. For example, while temporarily stopping the process at a predetermined timing during the process, the position of the converged spot of a laser beam in the workpiece is corrected by detecting laser-processed marks produced on the workpiece. According to another solution, the height of an upper surface of the workpiece or the position of a projected processing line on the workpiece is detected and corrected prior to the processing of the workpiece. However, these proposals are likely to need a time-consuming detecting process and hence a lengthy processing time. Furthermore, if the components affected by the heat are thermally expanded too much, then the proposed correcting procedures are not effective to avoid the processing shortcomings.

It is therefore an object of the present invention to provide a laser processing apparatus that corrects a shift caused in the position of the converged spot of a laser beam due to the effect of a thermal expansion of components that is brought about by heat generated by a moving mechanism, thereby enhancing the processing quality.

In accordance with an aspect of the present invention, there is provided a laser processing apparatus including a holding mechanism for holding a workpiece, a laser beam applying mechanism for applying a laser beam to the workpiece held by the holding mechanism while keeping a converged spot of the laser beam in the workpiece, a moving mechanism for moving the holding mechanism in a processing feed direction and an indexing feed direction, a controller for controlling at least the laser beam applying mechanism and the moving mechanism, and a temperature detector for detecting a temperature of the holding mechanism or a temperature of an actuator of the moving mechanism that moves the holding mechanism in the processing feed direction. The laser beam applying mechanism has a converged spot position adjusting unit for adjusting a position of the converged spot of the laser beam in a thicknesswise direction of the workpiece. The controller, depending on a temperature change detected by the temperature detector, controls the converged spot position adjusting unit to establish a position of the converged spot of the laser beam in the thicknesswise direction of the workpiece, and controls the actuator to establish a position of the converged spot of the laser beam in the indexing feed direction, thereby correcting the positions of the converged spot of the laser beam.

Preferably, the controller stores in advance a correlation map defining a correlation between temperature changes of the holding mechanism or the actuator and changes in the position of the converged spot, and the controller acquires a change in the position of the converged spot that corresponds to the temperature change detected by the temperature detector by referring to the correlation map, and corrects the position of the converged spot of the laser beam, using a corrective value corresponding to the acquired change in the position of the converged spot.

Preferably, the actuator of the moving mechanism that moves the holding mechanism in the processing feed direction is a linear motor having electromagnetic coils, and the temperature detector detects a temperature of the electromagnetic coils.

In accordance with another aspect of the present invention, there is provided a method of correcting a position of a converged spot of a laser beam in a laser processing apparatus including a holding mechanism for holding a workpiece, a laser beam applying mechanism for applying the laser beam to the workpiece held by the holding mechanism while keeping the converged spot of the laser beam in the workpiece, a moving mechanism for moving the holding mechanism in a processing feed direction and an indexing feed direction, a controller for controlling at least the laser beam applying mechanism and the moving mechanism, and a temperature detector for detecting a temperature of the holding mechanism or a temperature of an actuator of the moving mechanism that moves the holding mechanism in the processing feed direction. The laser beam applying mechanism has a converged spot position adjusting unit for adjusting the position of the converged spot of the laser beam in a thicknesswise direction of the workpiece. The method includes a temperature detecting step of detecting the temperature with the temperature detector, a corrective value calculating step of calculating a corrective value for shifting the position of the converged spot of the laser beam on the basis of the detected temperature, and a converged spot position correcting step of, on the basis of the corrective value, controlling the converged spot position adjusting unit to establish a position of the converged spot of the laser beam in the thicknesswise direction of the workpiece and controlling the actuator to establish a position of the converged spot of the laser beam in the indexing feed direction, thereby correcting the positions of the converged spot of the laser beam.

Preferably, the controller stores in advance a correlation map defining a correlation between temperature changes of the holding mechanism or the actuator and changes in the position of the converged spot, and the controller, in the corrective value calculating step, acquires a change in the position of the converged spot that corresponds to the temperature change detected by the temperature detector by referring to the correlation map, and calculates a corrective value corresponding to the acquired change in the position of the converged spot.

Preferably, the actuator of the moving mechanism that moves the holding mechanism in the processing feed direction is a linear motor having electromagnetic coils, and the temperature detector detects a temperature of the electromagnetic coils.

According to the present invention, it is possible to correct a shift in the position of the converged spot of the laser beam in the workpiece, thereby preventing the position of the converged spot of the laser beam in the workpiece from being shifted due to the thermal expansion of the holding mechanism.

Furthermore, as the temperature of the actuator that processing-feeds the holding mechanism at a high speed is directly detected by the temperature detector, a temperature change can be recognized early for positional correction with higher accuracy.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 6A is a schematic view illustrative of the position of the converged spot at the reference temperature;

FIG. 6B is a schematic view illustrative of a shift in the −Z-axis direction of the position of the converged spot upon a temperature rise;

FIG. 6C is a schematic view illustrative of the position of the converged spot that has been corrected.

DETAILED DESCRIPTION OF THE PREFERRED EMBODIMENT

Figure 1:
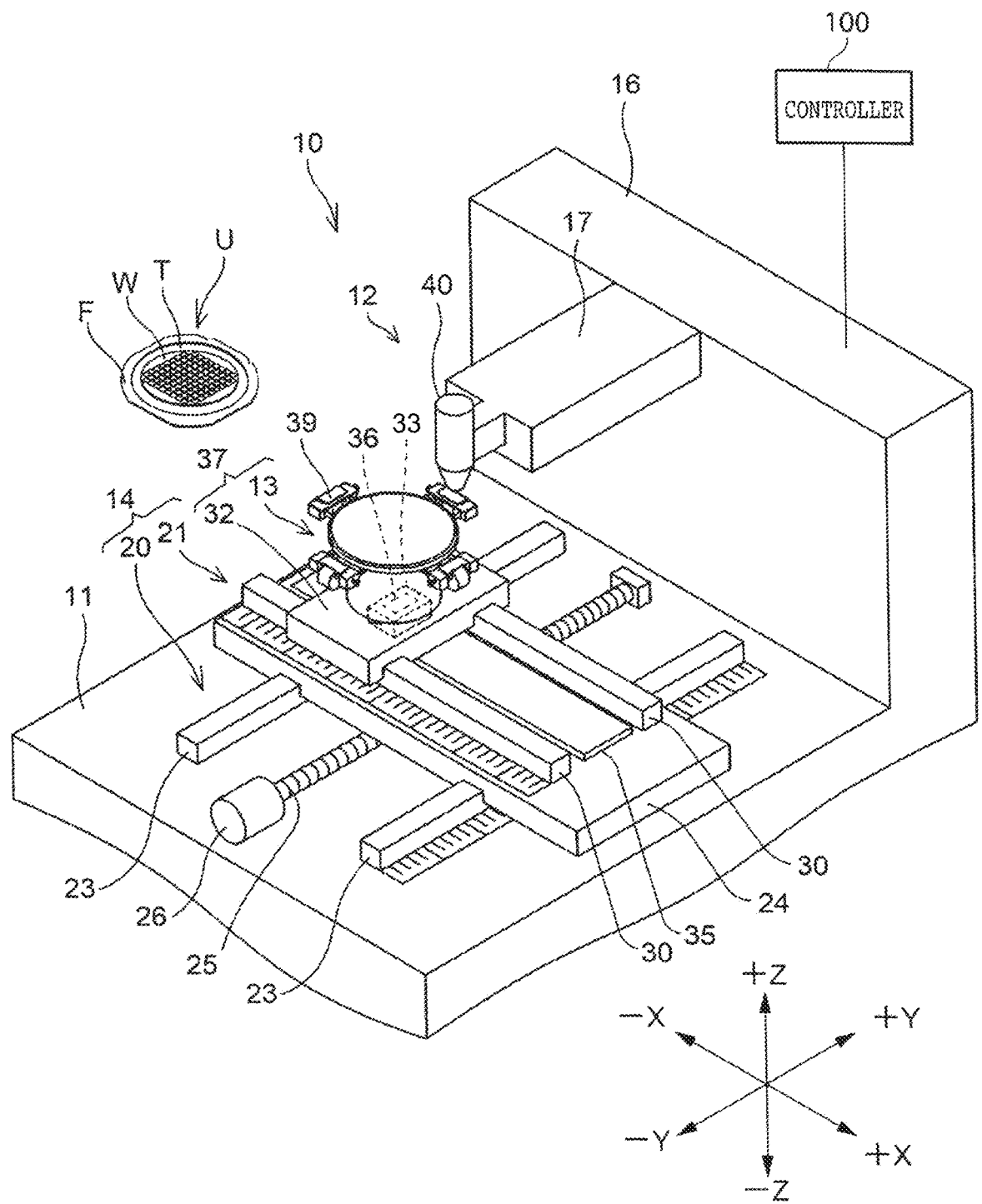
FIG. 1 is a perspective view of a laser processing apparatus according to an embodiment of the present invention.

FIG. 1 illustrates in perspective a laser processing apparatus 10 according to an embodiment of the present invention. As illustrated in FIG. 1, the laser processing apparatus 10 includes a laser beam applying mechanism 12 for applying a laser beam and a holding table 13 for holding a workpiece W to be processed thereon. The laser processing apparatus 10 is arranged to move the laser beam applying mechanism 12 and the holding table 13 relatively to each other and apply the laser beam from the laser beam applying mechanism 12 to the workpiece W held on the holding table 13, thereby processing the workpiece W with the laser beam.

The laser processing apparatus 10 will be described in relation to a three-dimensional coordinate system including X, Y, and Z axes extending respectively along X-axis, Y-axis, and Z-axis directions. The X-axis directions extend horizontally and include a +X-axis direction and a −X-axis direction, and the Y-axis directions extend horizontally perpendicularly to the X-axis directions and include a +Y-axis direction and a −Y-axis direction. The Z-axis directions extend vertically perpendicularly to the X-axis directions and the Y-axis directions and include a +Z-axis direction and a −Z-axis direction.

The workpiece W is a semiconductor wafer shaped as a circular plate, such as a silicon wafer. The workpiece W has a face side, illustrated as an upper side in FIG. 1, including a plurality of rectangular areas demarcated by a grid of projected dicing lines and having a plurality of devices such as integrated circuits (ICs) and large scale integration (LSI) circuits formed in the respective rectangular areas. The workpiece W may be made of any of other materials including ceramic, glass, sapphire, or the like as well as semiconductor materials including silicon or the like.

The workpiece W is affixed to a tape T and fixedly supported on an annular frame F by the tape T. The workpiece W, the tape T, and the annular frame F jointly make up a workpiece unit U that will be handled as one piece on the laser processing apparatus 10.

The laser processing apparatus 10 has a base 11 shaped as a rectangular parallelepiped. The base 11 supports on an upper surface thereof a moving mechanism 14 for processing-feeding the holding table 13 in the X-axis directions and indexing-feeding the holding table 13 in the Y-axis directions. An upstanding wall 16 is erected from the base 11 behind the moving mechanism 14. The laser beam applying mechanism 12 is supported on an arm 17 that protrudes from a front face of the upstanding wall 16 in overhanging relation to the holding table 13.

The moving mechanism 14 includes an indexing feed mechanism 20 for moving the holding table 13 and the laser beam applying mechanism 12 relatively to each other in indexing feed directions, i.e., the Y-axis directions, and a processing feed mechanism 21 for moving the holding table 13 and the laser beam applying mechanism 12 relatively to each other in processing feed directions, i.e., the X-axis directions.

The indexing feed mechanism 20 includes a pair of guide rails 23 disposed on the upper surface of the base 11 and extending parallel to the Y-axis directions, and a drive motor 26 for moving a Y-axis movable table 24 slidably mounted on the guide rails 23 in the indexing feed directions along the guide rails 23. After the laser beam applying mechanism 12 has processed the workpiece W along one of the projected dicing lines thereon, the indexing feed mechanism 20 indexing-feeds the workpiece W on the holding table 13 by a predetermined distance in one of the indexing feed directions for the laser beam applying mechanism 12 to process the workpiece W along a next one of the projected dicing lines thereon.

A nut, not illustrated, is fixedly mounted on a lower surface of the Y-axis movable table 24, and a ball screw 25 disposed between and extending parallel to the guide rails 23 is operatively threaded through the nut. When the drive motor 26 that is coupled to an end of the ball screw 25 is energized, it rotates the ball screw 25 about its central axis, causing the nut to move the Y-axis movable table 24 and the processing feed mechanism 21 and the holding table 13 that are mounted on the Y-axis movable table 24 in one of the Y-axis directions along the guide rails 23. The indexing feed mechanism 20 may alternatively include a linear motor, not illustrated, as is the case with the processing feed mechanism 21 to be described below.

The processing feed mechanism 21 includes a pair of guide rails 30 disposed on an upper surface of the Y-axis movable table 24 and extending parallel to the X-axis directions, and an actuator 33 for moving an X-axis movable table 32 slidably mounted on the guide rails 30 in the processing feed directions along the guide rails 30.

The actuator 33 includes a linear motor mounted on a lower portion of the X-axis movable table 32 and including electromagnetic coils, not illustrated, positioned in vertically facing relation to a magnet plate 35 disposed on the Y-axis movable plate 24 between the guide rails 30 and extending in along the X-axis directions. The electromagnetic coils are successively energized by three-phase alternating currents flowing therethrough in successive phases for generating a moving magnetic field that moves the actuator 33 itself and the X-axis movable table 32 in reciprocating strokes along the X-axis directions.

The actuator 33 includes a temperature detector 36 for detecting a temperature of the electromagnetic coils of the linear motor. The temperature detector 36 detects a temperature of the actuator 33. Since the actuator 33 moves the X-axis movable table 32 and hence the holding table 13 at a high speed in the reciprocating strokes when the processing feed mechanism 21 is in operation, the electromagnetic coils generate a large amount of heat, tending to thermally expand surrounding components.

The temperature detector 36 is incorporated in the actuator 33 for measuring the temperature of the electromagnetic coils. Alternatively, the temperature detector 36 may be disposed on the X-axis movable table 32 independently of the actuator 33. Alternatively, the temperature detector 36 may detect a temperature of a holding mechanism 37, which includes the X-axis movable table 32 and the holding table 13, for holding the workpiece W, and may detect a temperature change caused by the heat of the actuator 33 from the detected temperature.

The holding table 13 is mounted on an upper surface of the X-axis movable table 32. The holding table 13 is rotatable in a θ direction about its central axis extending vertically in the Z-axis directions. A suction member made of porous ceramic is placed on an upper surface of the holding table 13. Four clamps 39 are disposed around the holding table 13 at angularly spaced positions. The four clamps 39 are actuated by air actuators, not illustrated, to clamp the annular frame F of the workpiece unit U at the four positions around the holding table 13 to keep the workpiece W stably on the suction member.

The X-axis movable table 32 and the holding table 13 jointly make up the holding mechanism 37 for holding the workpiece W. The holding mechanism 37 is movable as a whole in the processing feed directions and the indexing feed directions.

The laser beam applying mechanism 12 has a processing head 40 mounted on a distal end of the arm 17. The laser beam applying mechanism 12 includes an optical system, etc. housed in the arm 17 and the processing head 40.

Figure 2:
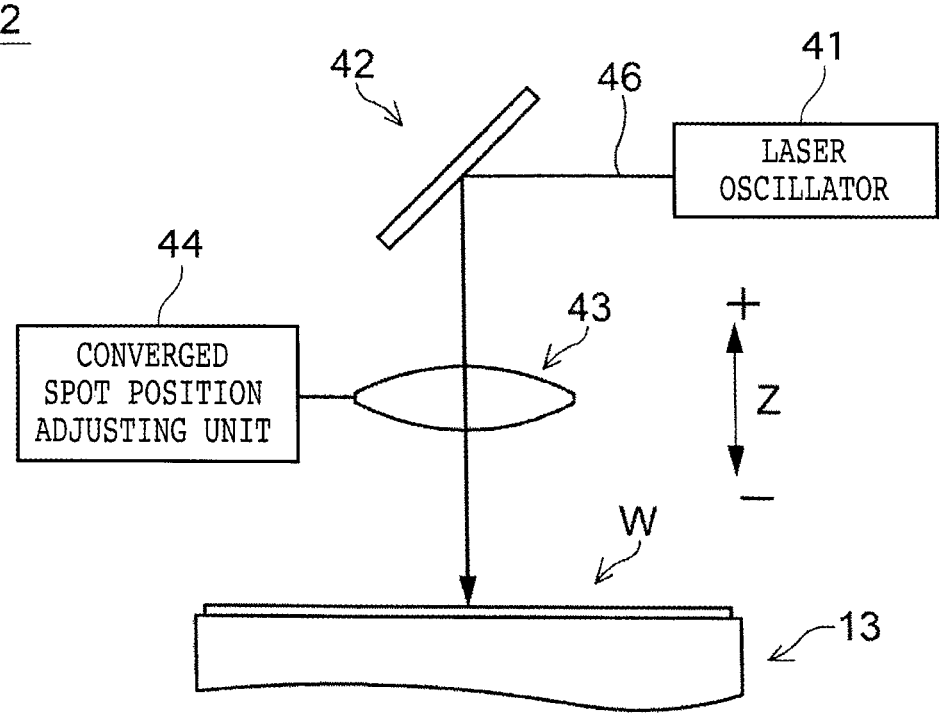
FIG. 2 is an elevational view of an optical system, etc. of a laser beam applying mechanism of the laser processing apparatus.

FIG. 2 illustrates in elevation the optical system, etc. of the laser beam applying mechanism 12. The laser beam applying mechanism 12 includes a laser oscillator 41 for emitting a laser beam 46, a mirror 42 for reflecting the laser beam 46 emitted from the laser oscillator 41, a condensing lens 43 for converging the laser beam 46 reflected by the mirror 42 and applying the converged laser beam 46 to the workpiece W, and a converged spot position adjusting unit 44 for moving the condensing lens 43 in the Z-axis directions to adjust the position of the converged spot, i.e., focused spot, of the laser beam 46.

The laser beam 46 emitted from the laser oscillator 41 is a YAG laser beam or a YVO laser beam, for example. The laser beam 46 applied to the workpiece W may process the workpiece W according to different processes. One of the processes is an ablation process in which a laser beam having a wavelength absorbable by the workpiece W is applied to form laser-processed grooves in the face side of the workpiece W. Another process is what is generally called a stealth dicing process in which a laser beam having a wavelength transmittable through the workpiece W is applied to form modified layers in the workpiece W.

Next, an arrangement for correcting the position of the converged spot of the laser beam will be described below.

Figure 3:
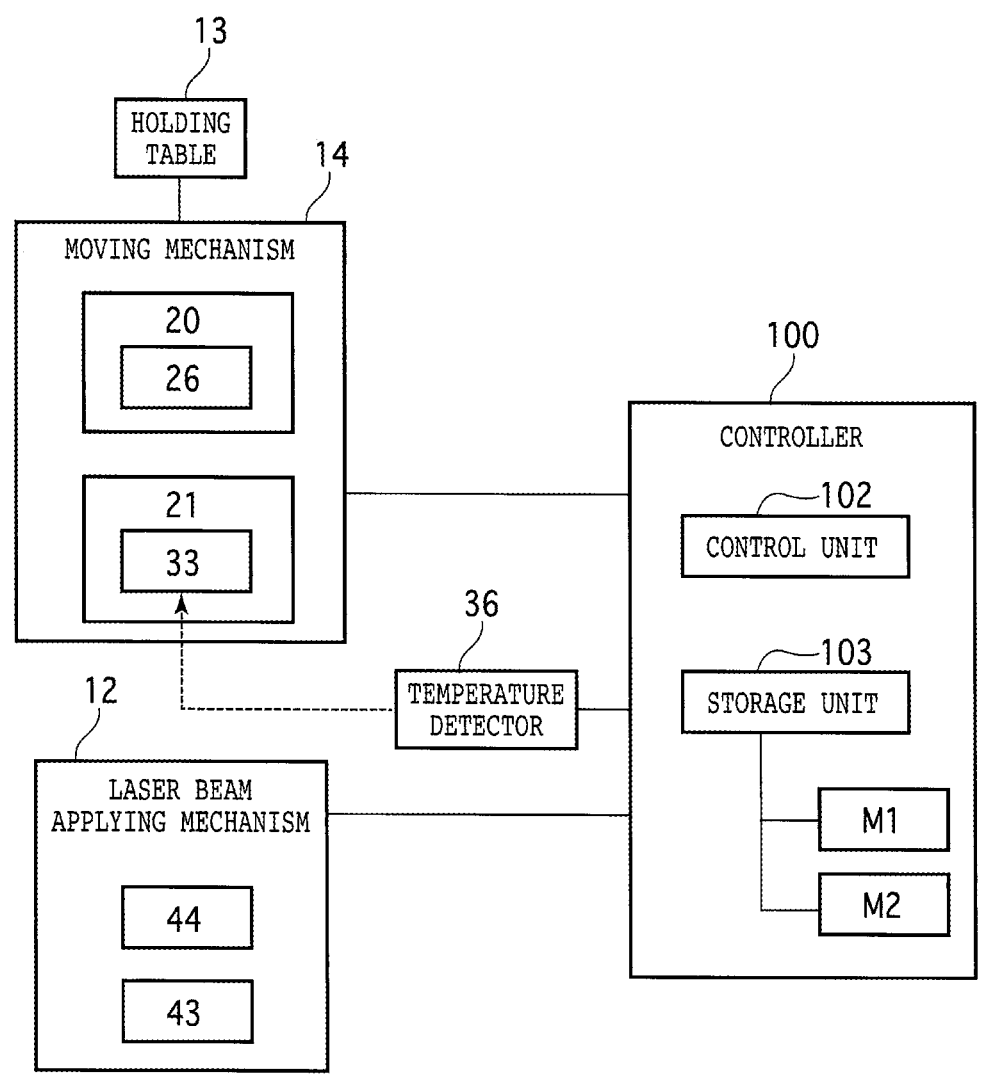
FIG. 3 is a block diagram of a controller of the laser processing apparatus and components of the laser processing apparatus that are controlled by the controller.

FIG. 3 illustrates in block form a controller 100 of the laser processing apparatus 10 and components of the laser processing apparatus 10 that are controlled by the controller 100. The controller 100 has a control unit 102 for controlling the moving mechanism 14 and the laser beam applying mechanism 12, and a storage unit 104 for storing various kinds of data.

The control unit 102 controls the moving mechanism 14 to move the holding table 13. Specifically, the control unit 102 controls operation of the indexing feed mechanism 20, i.e., the drive motor 26, to move the holding table 13 (see FIG. 1) in the indexing feed directions, i.e., the Y-axis directions. The control unit 102 also controls the processing feed mechanism 21, i.e., the actuator 33, to move the holding table 13 in the processing feed directions, i.e., the X-axis directions.

Furthermore, the control unit 102 controls operation of the converged spot position adjusting unit 44 to move the condensing lens 43 (see FIG. 2) in heightwise directions, i.e., the Z-axis directions, to change the position of the converged spot in the Z-axis directions. The temperature detector 36 is electrically connected to the controller 100, so that the temperature detected by the temperature detector 36 can be input to the control unit 102.

Figure 4A:
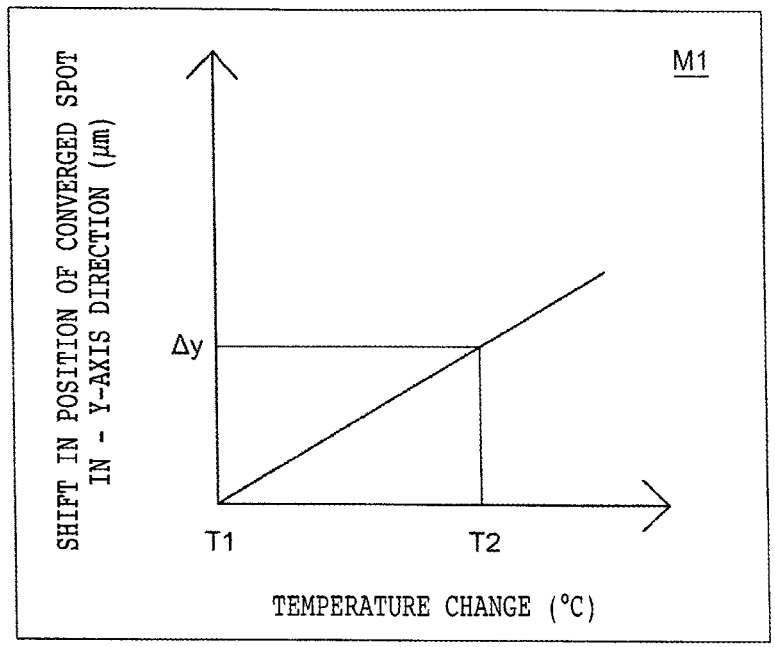
FIG. 4A is a map of a correlation between temperatures of an actuator and shifts in a −Y-axis direction of a converged spot in a workpiece.
Figure 4B:
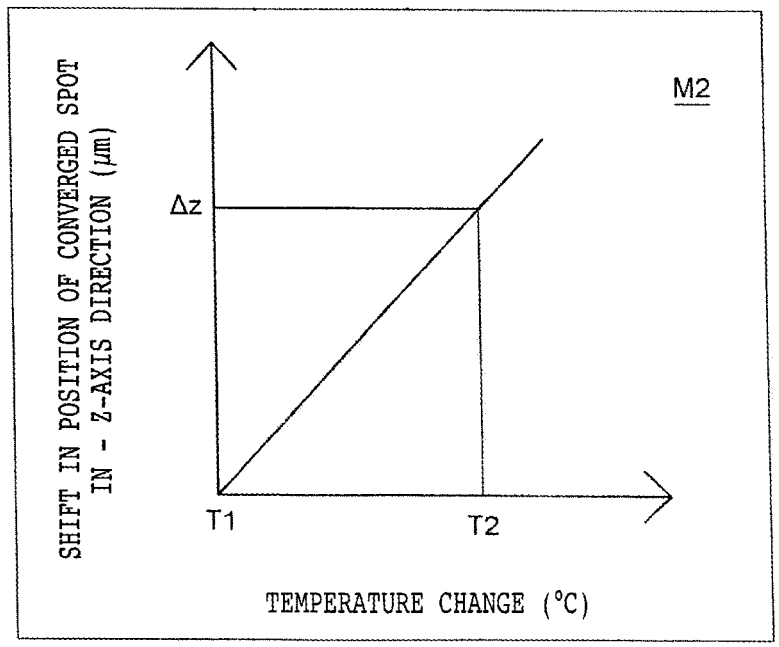
FIG. 4B is a map of a correlation between temperatures of the actuator and shifts in a −Z-axis direction of the converged spot in the workpiece.

The storage unit 104 stores correlation maps M1 and M2 illustrated respectively in FIGS. 4A and 4B. The correlation map M1 illustrated in FIG. 4A has a horizontal axis representing temperature values (° C.) of the actuator 33 (see FIG. 1) and a vertical axis representing shifts (μm) in the −Y-axis direction of the converged spot in the workpiece W, and defines a correlation between the temperature values and the shifts. The correlation map M1 is obtained on the basis of temperature values measured by the temperature detector 36 (see FIG. 1) and Y-axis coordinates of the converged spot detected at the time the temperature values are measured.

The correlation map M1 indicates that, as the temperature of the actuator 33 becomes progressively higher than a reference temperature T1, the converged spot is progressively shifted in the −Y-axis direction. Specifically, in the configuration illustrated in FIG. 1, when the X-axis movable table 32 is thermally expanded due to a temperature rise of the actuator 33, the holding table 13 is shifted in the +Y-axis direction from a reference position therefor. At this time, the relative position of the holding table 13 with respect to the laser beam applying mechanism 12 is shifted in the +Y-axis direction, causing the converged spot to shift in the −Y-axis direction within the workpiece W. At the reference temperature T1, the converged spot is not shifted in the Y-axis directions within the workpiece W, and is positioned at a designed position.

Figure 5A:
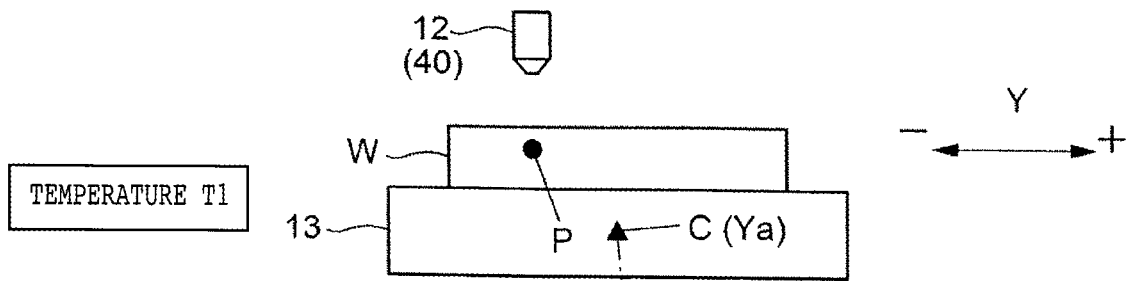
FIG. 5A is a schematic view illustrative of a position of the converged spot at a reference temperature.
Figure 5B:
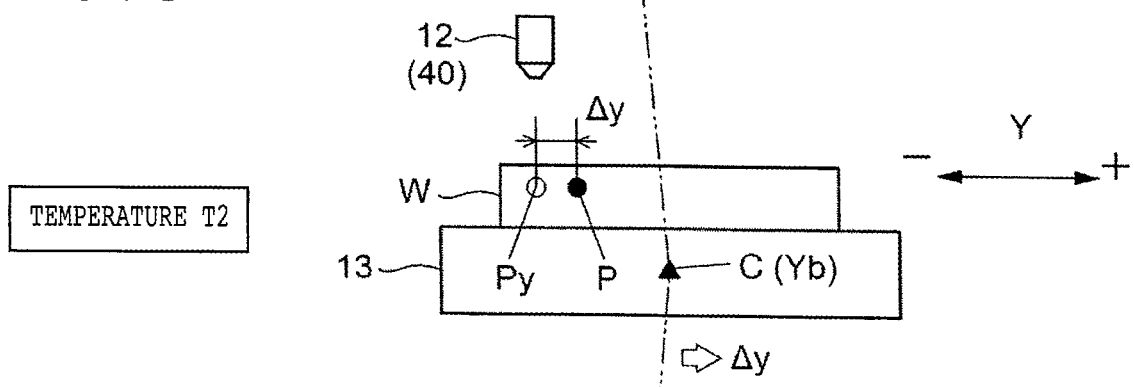
FIG. 5B is a schematic view illustrative of a shift in the −Y-axis direction of the position of the converged spot upon a temperature rise.

More specifically, as illustrated in FIG. 5A, at the reference temperature T1, the holding table 13 has a center C whose Y-axis coordinate is represented by Ya, and the converged spot, denoted by P, is disposed at a predetermined position within the workpiece W. When the temperature rises to a temperature T2, as illustrated in FIG. 5B, the center C of the holding table 13 moves Δy in the +Y-axis direction and has a Y-axis coordinate represented by Yb, and the converged spot P is shifted to a position Py that is spaced Δy in the −Y-axis direction.

When the holding table 13 is thus shifted in the +Y-axis direction, therefore, the converged spot P is shifted in the −Y-axis direction within the workpiece W. This is because the laser beam applying mechanism 12 is not moved in the Y-axis directions, and only the holding table 13 is moved in the Y-axis directions because of the thermal expansion.

Similarly, the correlation map M2 illustrated in FIG. 4B has a horizontal axis representing temperature values (° C.) of the actuator 33 (see FIG. 1) and a vertical axis representing shifts (μm) in the −Z-axis direction of the converged spot in the workpiece W, and defines a correlation between the temperature values and the shifts. The correlation map M2 is obtained on the basis of temperature values measured by the temperature detector 36 (see FIG. 1) and Z-axis coordinates of the converged spot detected at the time the temperature values are measured.

The correlation map M2 indicates that, as the temperature of the actuator 33 becomes progressively higher than the reference temperature T1, the converged spot is progressively shifted in the −Z-axis direction. Specifically, according to the present embodiment, in the configuration illustrated in FIG. 1, when the X-axis movable table 32 is thermally expanded due to a temperature rise of the actuator 33, the holding table 13 is shifted in the +Z-axis direction from a reference position therefor. At this time, the relative position of the holding table 13 with respect to the laser beam applying mechanism 12 is shifted in the +Z-axis direction, causing the converged spot to shift in the −Z-axis direction within the workpiece W. At the reference temperature T1, the converged spot is not shifted in the Z-axis directions within the workpiece W, and is positioned at a designed position.

More specifically, as illustrated in FIG. 6A, at the reference temperature T1, the holding table 13 has a center C whose Z-axis coordinate is represented by Za, and the converged spot P is disposed at a predetermined position within the workpiece W. When the temperature rises to the temperature T2, as illustrated in FIG. 6B, the center C of the holding table 13 moves Δz in the +Z-axis direction and has a Z-axis coordinate represented by Zb, and the converged spot P is shifted to a position Pz that is spaced Δz in the −Z-axis direction.

When the holding table 13 is thus shifted in the +Z-axis direction, therefore, the converged spot P is shifted in the −Z-axis direction within the workpiece W. This is because the laser beam applying mechanism 12, i.e., the condensing lens 43, is not moved in the Z-axis directions, and only the holding table 13 is moved in the Z-axis directions because of the thermal expansion.

Data for producing the correlation maps M1 and M2 vary from laser processing apparatus to laser processing apparatus and also from environment to environment in which to install the laser processing apparatus. The correlation maps M1 and M2 may be produced by performing a test process for data acquisition in a manufacturing process before the laser processing apparatus is shipped from a factory and then may be stored in the storage unit 104, or alternatively may be produced by performing a test process for data acquisition after the laser processing apparatus has been installed and then may be stored in the storage unit 104.

Figure 7:
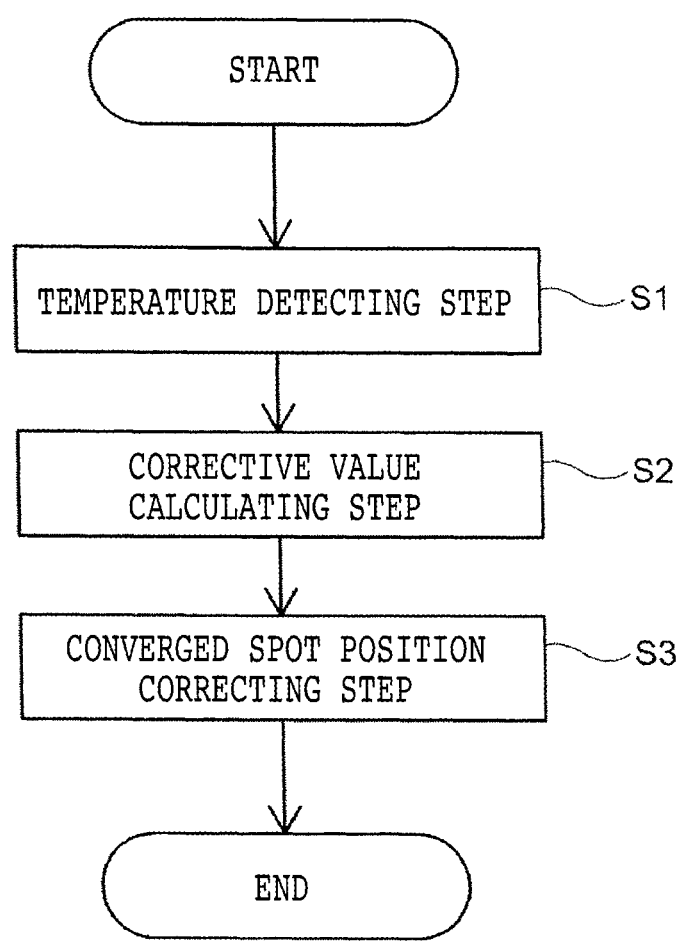
FIG. 7 is a flowchart of a control method of correcting the position of the converged spot.

A control method of correcting the position of the converged spot on the laser processing apparatus 10 thus arranged will be described hereinbelow. FIG. 7 is a flowchart of the control method. The control method illustrated in FIG. 7 is carried out in a laser processing procedure such as an ablation process or a stealth dicing process referred to above.

Specifically, as illustrated in FIG. 1, the workpiece W to be processed has a grid of projected dicing lines in two groups perpendicular to each other. The holding table 13 that is holding the workpiece W thereon is moved in a processing feed direction, i.e., one of the X-axis directions, during which time the workpiece W is processed by the laser beam 46 along one of the projected dicing lines extending in a first direction. Thereafter, the holding table 13 is moved in an indexing feed direction, i.e., one of the Y-axis directions, and then the workpiece W is processed by the laser beam 46 along a next adjacent one of the projected dicing lines extending in the first direction. After the workpiece W has been processed along all the projected dicing lines extending in the first direction, the holding table 13 is turned 90 degrees about its central axis. Then, the workpiece W is processed by the laser beam 46 along the projected dicing lines extending in a second direction perpendicular to the first direction. The control method is carried out in the above laser processing procedure, as follows:

<Temperature Detecting Step>

A temperature detecting step S1 is a step in which the temperature detector 36 detects the temperature of the holding mechanism 37 or the temperature of the actuator 33. The temperature detector 36 may detect the temperature in real time at all times during the laser processing procedure or may detect the temperature at certain timings, and the storage unit 104 may store the temperature thus detected.

<Corrective Value Calculating Step>

A corrective value calculating step S2 is a step in which the correlation map defining the correlation between the temperature values and the shifts in the converged spot position is referred to, a shift in the converged spot position that corresponds to the temperature value detected by the temperature detector 36 is determined from the correlation map, and a corrective value for canceling out the shift is calculated.

Specifically, at the temperature T2, for example, the correlation map M1 illustrated in FIG. 4A is referred to, and the shift Δy is determined from the correlation map M1. In this case, as illustrated in FIG. 5B, the converged spot is moved by the shift Δy in the −Y-axis direction within the workpiece W.

Then, a corrective value is defined as a numerical value for cancelling out the shift Δy. The corrective value may be another numerical value calculated on the basis of the shift Δy, instead of being identical to the shift Δy. Similarly, with respect to the shift in the Z-axis direction illustrated in FIGS. 4B and 5B, a corrective value is defined on the basis of the shift Δz.

<Converged Spot Position Correcting Step>

A converged spot position correcting step S3 is a step in which the position of the converged spot in the workpiece W is corrected using the calculated corrective value. The position of the converged spot in the workpiece W may be corrected in real time at all times during the laser processing procedure or may be corrected at certain timings. For example, the position of the converged spot in the workpiece W may not be corrected while the holding table 13 is being moved in the processing feed directions, i.e., the X-axis directions, but may be corrected when the holding table 13 is moved, i.e., indexing-fed, in the indexing feed directions, i.e., the Y-axis directions, after the workpiece W has been processed by the laser beam along a certain projected dicing line.

Figure 5C:
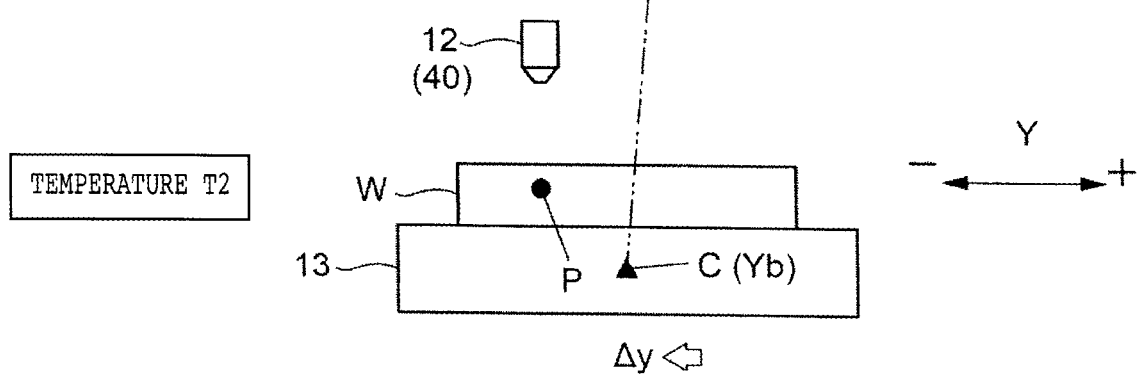
FIG. 5C is a schematic view illustrative of the position of the converged spot that has been corrected.

Specifically, as illustrated in FIG. 5C, the holding table 13 is moved by the corrective value Δy, i.e., the shift Δy, in the −Y-axis direction on the basis of the corrective value calculated in the corrective value calculating step S2, bringing the position in the Y-axis directions of the converged spot in the workpiece W into alignment with the position at the reference temperature T1.

Similarly, as illustrated in FIG. 6C, the converged spot position adjusting unit 44 is actuated to change the position in the Z-axis directions of the condensing lens 43 (see FIG. 2), moving the position of the converged spot by the corrective value Δz in the +Z-axis direction, to thereby bring the position in the Z-axis directions of the converged spot in the workpiece W into alignment with the position at the reference temperature T1.

By thus carrying out the converged spot position correcting step S3, the position of the converged spot in the workpiece W can be aligned with the position at the reference temperature T1, so that the converged spot in the workpiece W is prevented from being shifted due to the thermal expansion of the holding mechanism 37.

In the corrective value calculating step S2, instead of determining a corrective value by referring to the correlation map, a corrective value per unit temperature change may be determined. The position of the converged spot in the workpiece W may be corrected using the corrective value thus determined.

Specifically, providing it is confirmed that, when the temperature of the actuator 33 (see FIG. 1) rises by 5° C., the position in the Z-axis directions of the converged spot in the workpiece W is shifted by −20 μm and the position in the Y-axis directions of the converged spot in the workpiece W is shifted by +3 μm, the position of the converged spot in the workpiece W is corrected by +4 μm in the Z-axis directions and by −0.6 μm in the Y-axis directions per unit temperature change, i.e., per temperature rise of 1° C.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
a holding mechanism for holding a workpiece;
a laser beam applying mechanism for applying a laser beam to the workpiece held by the holding mechanism while keeping a converged spot of the laser beam in the workpiece;
a moving mechanism for moving the holding mechanism in a processing feed direction and an indexing feed direction;
a controller for controlling at least the laser beam applying mechanism and the moving mechanism; and
a temperature detector for detecting a temperature of the holding mechanism or a temperature of an actuator of the moving mechanism that moves the holding mechanism in the processing feed direction, and
the controller, depending on a temperature change detected by the temperature detector,
controls the laser beam applying mechanism to establish a thicknesswise direction position of the converged spot of the laser beam in the thicknesswise direction of the workpiece, and
controls the actuator to establish an indexing feed direction position of the converged spot of the laser beam in the indexing feed direction, thereby correcting the positions of the converged spot of the laser beam.

2. The laser processing apparatus according to claim 1, wherein the controller stores in advance a correlation map defining a correlation between temperature changes of the holding mechanism or the actuator and changes in the position of the converged spot, and
the controller acquires a change in the position of the converged spot that corresponds to the temperature change detected by the temperature detector by referring to the correlation map, and
corrects the position of the converged spot of the laser beam, using a corrective value corresponding to the acquired change in the position of the converged spot.

3. The laser processing apparatus according to claim 1, wherein the actuator of the moving mechanism that moves the holding mechanism in the processing feed direction is a linear motor having electromagnetic coils, and
the temperature detector detects a temperature of the electromagnetic coils.

4. A method of correcting a position of a converged spot of a laser beam in a laser processing apparatus including a holding mechanism for holding a workpiece, a laser beam applying mechanism for applying the laser beam to the workpiece held by the holding mechanism while keeping the converged spot of the laser beam in the workpiece, a moving mechanism for moving the holding mechanism in a processing feed direction and an indexing feed direction, a controller for controlling at least the laser beam applying mechanism and the moving mechanism, and a temperature detector for detecting a temperature of the holding mechanism or a temperature of an actuator of the moving mechanism that moves the holding mechanism in the processing feed direction, the method comprising:
a temperature detecting step of detecting a temperature with the temperature detector; and
a converged spot position correcting step of, on a basis of the detected temperature, controlling the laser beam applying mechanism to establish a thicknesswise direction position of the converged spot of the laser beam in the thicknesswise direction of the workpiece, and controlling the actuator to establish an indexing feed direction position of the converged spot of the laser beam in the indexing feed direction, thereby correcting the positions of the converged spot of the laser beam.

5. The method according to claim 4,
wherein the controller stores in advance a correlation map defining a correlation between temperature changes of the holding mechanism or the actuator and changes in the position of the converged spot.

6. The method according to claim 4,
wherein the actuator of the moving mechanism that moves the holding mechanism in the processing feed direction is a linear motor having electromagnetic coils, and
the temperature detector detects a temperature of the electromagnetic coils.

* * * * *